United States Patent

Ripley et al.

[11] Patent Number: 5,870,670
[45] Date of Patent: Feb. 9, 1999

[54] INTEGRATED IMAGE REJECT MIXER

[75] Inventors: David Steven Ripley; William T. Waldie, both of Round Lake Beach, Ill.

[73] Assignee: Motorola, Inc., Schaumburg, Ill.

[21] Appl. No.: 717,877

[22] Filed: Sep. 23, 1996

[51] Int. Cl.⁶ ..................................................... H04B 1/16
[52] U.S. Cl. ........................... 455/304; 455/318; 455/324
[58] Field of Search ..................... 455/302, 303, 455/304, 305, 306, 317, 318, 319, 320, 323, 324, 325, 326, 330, 333, 126; 375/329, 334, 335, 336, 339, 344

[56] References Cited

U.S. PATENT DOCUMENTS

| | | | |
|---|---|---|---|
| 4,622,525 | 11/1986 | Brown . | |
| 4,731,875 | 3/1988 | Mizukami et al. | 455/302 |
| 4,745,378 | 5/1988 | Niitsuma et al. . | |
| 4,873,491 | 10/1989 | Wilkins . | |
| 4,908,532 | 3/1990 | Chadwick | 307/512 |
| 5,020,147 | 5/1991 | Okanobu | 455/302 |
| 5,140,198 | 8/1992 | Atherly et al. | 455/302 |
| 5,203,030 | 4/1993 | Kawasaki | 455/304 |
| 5,265,267 | 11/1993 | Martin et al. | 455/326 |
| 5,371,902 | 12/1994 | Marz | 455/324 |
| 5,410,743 | 4/1995 | Seely et al. | 455/302 |
| 5,438,692 | 8/1995 | Mohindra | 455/324 |
| 5,483,681 | 1/1996 | Bergsten et al. | 455/126 |

*Primary Examiner*—Thanh Cong Le
*Attorney, Agent, or Firm*—Sylvia Chen

[57] ABSTRACT

An integrated image reject mixer (150) generates precise quadrature components using highly matched local-oscillator (LO) path and intermediate frequency (IF) path resistor-capacitor (RC) phase shifting networks (131, 138). Because the LO signal from a local oscillator (127) has a constant amplitude, a phase detector (136) feedback loop easily maintains an accurate ninety-degree phase difference between the quadrature LO signals (122, 124) from the LO path phase shifting network (131). Because the two phase shifting networks are matched, the feedback control signal (137) from the phase detector (136) can also be used to maintain an accurate ninety-degree phase difference between the quadrature IF signals (123, 128) from the IF path phase shifting network (138) despite the dynamically-varying amplitude of the IF signal. Thus, this image reject mixer uses only components that may be easily integrated into an integrated circuit.

21 Claims, 4 Drawing Sheets

5,870,670

INTEGRATED IMAGE REJECT MIXER

FIELD OF THE INVENTION

This invention relates generally to mixers for use in a transmitter or a receiver, and more particularly to a frequency conversion mixer implemented on an integrated circuit.

BACKGROUND OF THE INVENTION

Conventional radio receivers implement a mixer for frequency conversion of a signal from a desired frequency to an intermediate frequency. The intermediate frequency is the difference between an incoming carrier frequency and the local-oscillator frequency. These radio receivers, however, have to attenuate an undesired spurious response due to the fact that the mixer will convert two frequencies, the desired frequency and its image frequency, to the intermediate frequency. Generally, tuned filtering and careful selection of the intermediate frequency are used to reduce this undesired response.

An alternate way to reduce the spurious image response uses an image reject mixer. Image reject mixer frequency converters usually generate two signals, each with a desired signal component and an image signal component. The two desired signal components are in phase and the two image signal components are 180 degrees out of phase. When the two signals are summed together, the desired signal components add and the image signal components cancel. Generation of these phase-shifted image signals is typically accomplished with balanced-to-unbalanced transformers (baluns), tuned circuits, hybrid couplers, or surface acoustic wave (SAW) technology, none of which can be easily implemented on an integrated circuit (IC) without using an expensive trim process.

The inability to integrate an image reject mixer on an IC increases the number of components in the receiver, increases the size of the receiver and its production costs, and restricts the overall design of the printed circuit board used for the device. Thus, there is a need for a frequency conversion mixer that rejects the spurious image response yet can be integrated in an IC.

DETAILED DESCRIPTION OF THE PREFERRED EMBODIMENTS

An integrated image reject mixer generates precise quadrature components using matched local-oscillator (LO) path and intermediate frequency (IF) path resistor-capacitor (RC) phase shifting networks. Because the LO signal from a local oscillator has a constant amplitude, a phase detector feedback loop easily maintains an accurate ninety-degree phase difference in the LO path phase shifting network. The two phase shifting networks are closely matched so that the feedback control signal from the phase detector can also be used to maintain an accurate ninety-degree phase difference in the IF path phase shifting network despite the dynamically-varying amplitude of the IF signal. This image reject mixer uses only components that may be easily integrated into an IC to create an integrated image reject mixer, thus avoiding an expensive trim process.

Figure 1:
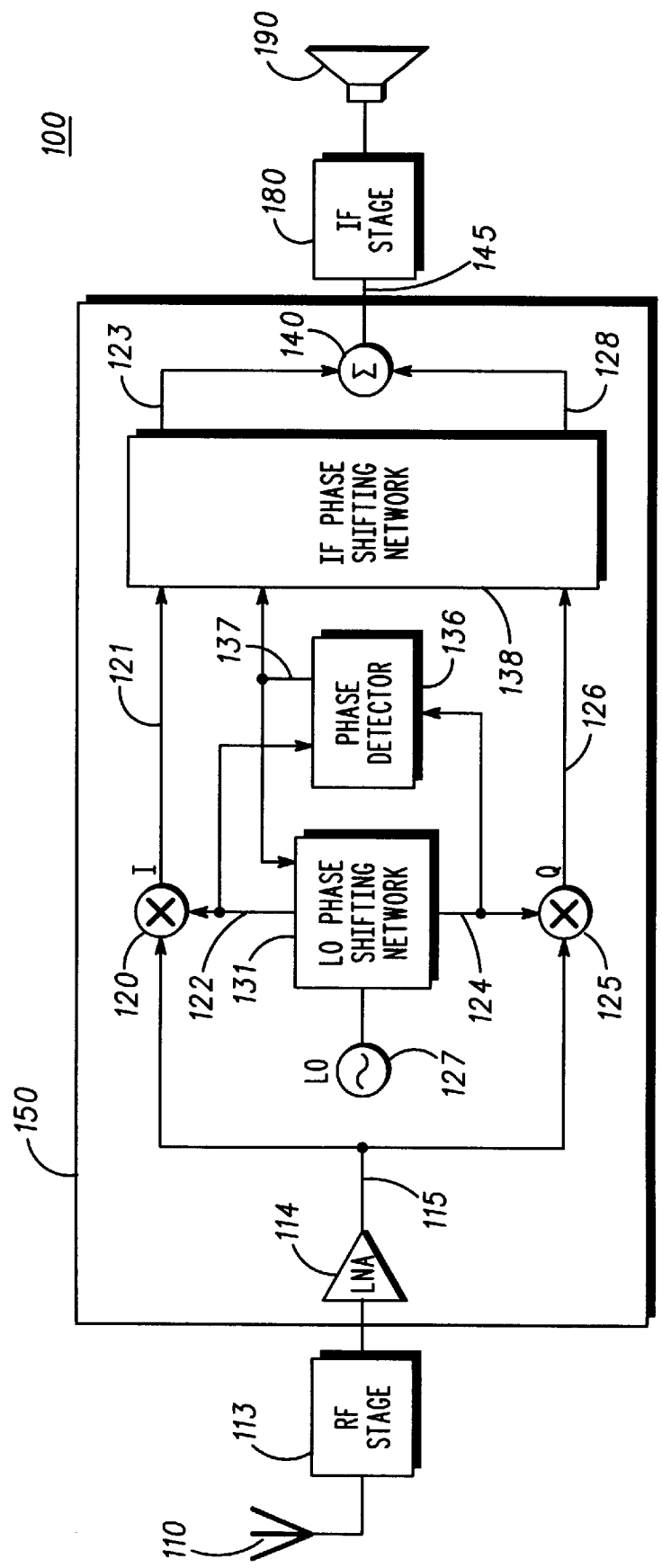
FIG. 1 shows a block diagram of an integrated image reject mixer as implemented in a receiver of a communication device according to a preferred embodiment.

FIG. 1 shows a block diagram of an integrated image reject mixer as implemented in a receiver of a communication device according to a preferred embodiment. The communication device 100 shown in this drawing represents a radiotelephone, however, other communication devices such as radios or televisions may use the integrated image reject mixer 150 in their receivers. A radio frequency (RF) signal is obtained from an antenna 110 and processed through RF stage 113, which converts the received RF signal down to a first IF signal. The first IF signal is connected to the integrated image reject mixer 150 having an integrated active double-balanced in-phase (I) mixer 120 and quadrature (Q) mixer 125.

The structure of the LO and IF path phase shifting networks 131, 138 in the integrated image reject mixer 150 produces outputs with amplitudes that are 3 dB below the input signal and shifted ±45 degrees. As a result, the effective noise figure of the integrated image reject mixer 150 is degraded by more than 3 dB. The addition of a low noise amplifier 114, with adequate gain to overtake the noise figure, to create an amplified IF signal 115 reduces the effective noise figure of the system. Note that the low noise amplifier 114 is optional, but it is preferred for high-performance receivers.

The in-phase mixer 120 combines the incoming amplified IF signal 115 with an in-phase LO signal 122 generated by LO path phase shifting network 131, which shifts the LO signal from the local oscillator 127 by ±45 degrees. A quadrature LO signal 124 from LO path phase shifting network 131 is combined with the amplified IF signal 115 in quadrature mixer 125. Note that the ±45 degree phase shift may be easily replaced by a 0 degree phase shift and 90 degree phase shift, or the like, to create equivalent quadrature signals. A phase locked loop containing phase detector 136 provides a feedback control signal 137 to LO path phase shifting network 131 to ensure that the phase difference between the quadrature LO signals 122, 124 of the LO path phase shifting network 131 does not vary from ninety degrees.

At the outputs of mixers 120, 125, an IF path phase shifting network 138 shifts the phase of the mixer output signals 121, 126 to maintain precise quadrature between in-phase IF signal 123 and quadrature IF signal 128. This may be implemented either using a ±45 degree phase shift or a 0 degree phase shift and 90 degree phase shift, or the like. If the integrated image reject mixer 150 is produced with tight matching tolerances using, for example, a bipolar complementary metal-oxide semiconductor (BiCMOS) or complementary metal-oxide semiconductor (CMOS) process, the feedback control signal 137 can control both phase shifting networks 131, 138 to maintain accurate ninety-degree phase differences.

The in-phase IF signal 123 contains a desired signal component and an image signal component, while the quadrature IF signal 128 contains the desired signal component and the image signal component shifted in phase by 180 degrees. The in-phase and quadrature IF signals 123, 128 are combined in summer 140 to produce a summed signal 145 at the second intermediate frequency with the image signal components canceled. This summed signal 145 is connected to IF stage 180, where it is processed and further mixed down to baseband frequency for audio reproduction on a speaker 190.

As integrated circuits progress to operate at higher and higher frequencies, the integrated image reject mixer could be applied in the RF stage 113 as well as the frequency converter section shown.

Figure 2:
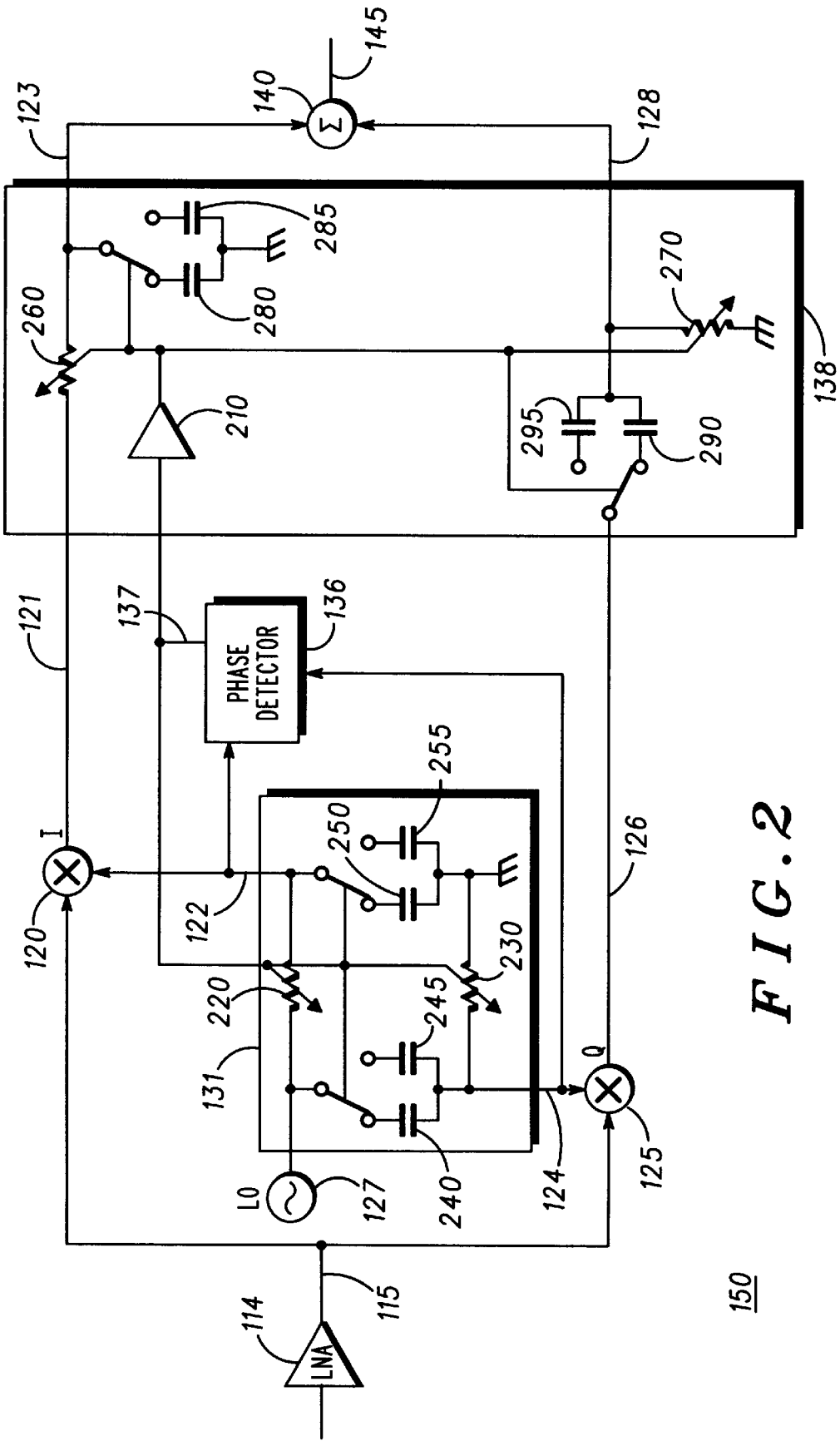
FIG. 2 shows details of the phase shifting networks and the phase detector in the receiver shown in FIG. 1 according to a preferred embodiment.

FIG. 2 shows details of the phase shifting networks and the phase detector in the receiver shown in FIG. 1 according to a preferred embodiment. In this example, the LO path phase shifting network 131 is implemented using a resistor-capacitor (RC) bridge having switched capacitors 240, 245, 250, 255 and variable resistors 220, 230. This implementation maximizes the operating frequency bandwidth of the phase shifting network. If simplification is desired, the two banks of switched capacitors may be replaced by single capacitors, or alternately the variable resistors may be exchanged for fixed resistors, resulting in a decrease in the operating frequency bandwidth.

Note that in this embodiment, the RC bridge in LO path phase shifting network 131 is driven single-endedly, thus the node between switched capacitors 250, 255 and variable resistor 230 is tied to ground. If the RC bridge was driven differentially, that node would be connected to an inverted component of a differential LO signal.

Phase detector 136 compares the phases of the in-phase LO signal 122 at the output of resistor 220 and the quadrature LO signal 124 at the output of capacitor 240. The phase difference between these two LO signals 122, 124 should be ninety degrees. A feedback control signal 137 from the phase detector 136 adjusts the variable resistors 220, 230 and the switched capacitors 240, 245, 250, 255 to insure that a ninety degree phase difference is maintained.

Due to the dynamic nature of the IF signal, however, a similar approach (using a separate phase detector coupled to the IF signal) is not practical in generating IF quadrature components. A separate phase detector would be unable to accurately detect a phase difference of two signals if the amplitude of one of the signals was varying widely. Designing a mixer to take advantage of the tight matching tolerances available in an advanced BiCMOS or CMOS process or the like, the resistors and capacitors in the IF path phase shifting network 138 are matched to the resistors and capacitors in the LO path phase shifting network 131. Thus, variable resistors 260, 270 and switched capacitors 280, 285, 290, 295 should have the same ratios as variable resistors 220, 230 and switched capacitors 240, 245, 250, 255. Also, the RC bridge in the IF path can be driven differentially as well as single-endedly (as shown).

The feedback control signal 137 originally generated to control the LO path phase shifting network 131 is now also used to control the IF path phase shifting network 138. Scaling of the resistive and capacitive elements in the phase shifting networks 131, 138 and/or scaling of the feedback control signal using amplifier 210, allows for compensation due to the differences in the IF and LO frequencies.

Figure 3:
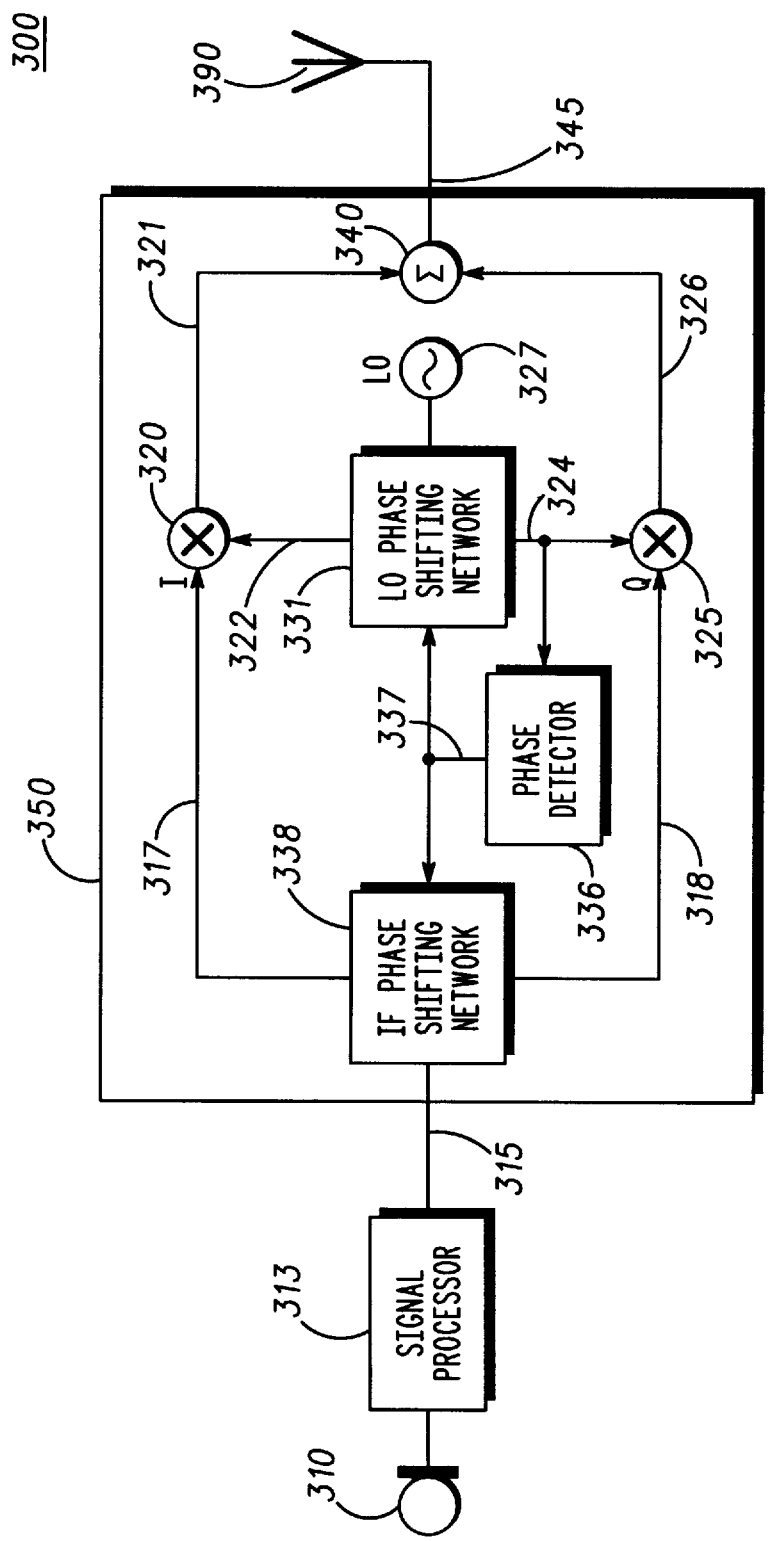
FIG. 3 shows a block diagram of an integrated image reject mixer as implemented in a transmitter of a communication device according to a preferred embodiment.

FIG. 3 shows a block diagram of an integrated image reject mixer as implemented in a transmitter of a communication device according to a preferred embodiment. The communication device 300 shown in this drawing represents a radiotelephone, however, other communication devices such as short wave radios may use the integrated image reject mixer. A microphone 310 receives an analog signal, and signal processor 313 filters the signal and connects it to integrated image reject mixer 350.

The processed signal 315 is connected to an IF path phase shifting network 338, which adjusts the phase of the signal 315 to produce an in-phase IF signal 317 and a quadrature IF signal 318. Preferably, the IF path phase shifting network 338 uses a ±45 degree phase shift, but it may alternately use a 0 degree phase shift and 90 degree phase shift, or the like, to create the in-phase and quadrature IF signals. The in-phase IF signal 317 is connected to an in-phase mixer 320 for mixing with an in-phase LO signal 322 from LO path phase shifting network 331.

The local oscillator 327 is connected to LO path phase shifting network 331 for shifting the phase of the LO signal by ninety degrees. Again, a ±45 degree phase shift or a 0 degree phase shift and 90 degree phase shift implementation, or the like, may be used. A phase locked loop with phase detector 336 insures that the phase difference does not vary from ninety degrees by providing a corrective feedback control signal 337. The quadrature LO signal 324 is connected to quadrature mixer 325 for mixing with the quadrature IF signal 318 from IF path phase shifting network 338. The feedback control signal 337 also controls the IF path phase shifting network 338 to insure that the IF phase difference is ninety degrees.

The output signal 321 of the in-phase mixer 320 and the output signal 326 of the quadrature mixer 325 are simply combined together in summer 340 to produce a summed signal 345 with the image signal component rejected. The summed signal 345 is then connected to antenna 390 preferably for broadcast to a complementary receiver such as the one shown in FIG. 1.

Figure 4:
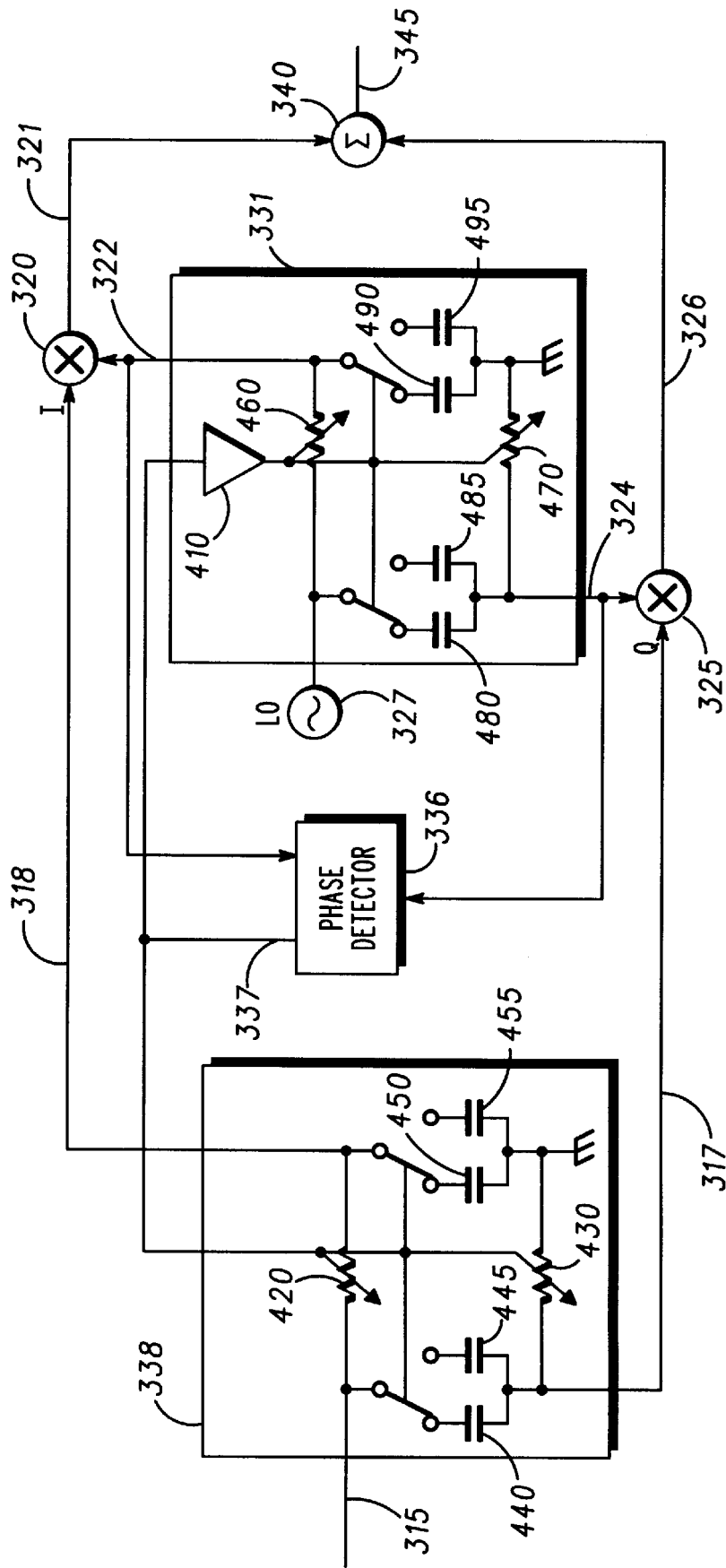
FIG. 4 shows details of the phase shifting networks and the phase detector in the transmitter shown in FIG. 3 according to a preferred embodiment.

FIG. 4 shows details of the phase shifting networks and the phase detector in the transmitter shown in FIG. 3 according to a preferred embodiment. In this example, the LO path phase shifting network 331 is implemented using a resistor-capacitor (RC) bridge having variable resistors 460, 470 and switched capacitors 480, 485, 490, 495. Instead of varying both the resistance and the capacitance in the RC bridge, the resistance only or the capacitance only may be varied with an attendant decrease in the operating frequency bandwidth of the integrated image reject mixer. The RC bridge may be driven either single-endedly or differentially depending on whether the node between switched capacitors 490, 495 and variable resistor 470 is tied to ground or to an inverted component of a differential signal. A feedback control signal 337 from the phase detector 336 controls the variable resistors 460, 470 and the switched capacitors 480, 485, 490, 495 to insure that a ninety degree phase difference is maintained between the quadrature LO signals 322, 324.

Similarly, an RC bridge with variable resistors 420, 430 and switched capacitors 440, 445, 450, 455 is used to implement IF path phase shifting network 338. This RC bridge may be driven either single-endedly or differentially depending on whether the node between switched capacitors 450, 455 and variable resistor 430 is tied to ground or to an inverted component of a differential signal. The feedback control signal 337 also is used to control variable resistors 420, 430 and switched capacitors 440, 445, 450, 455 in the manner that variable resistors 460, 470 and switched capacitors 480, 485, 490, 495 in LO path phase shifting network 331 are controlled.

Like the receiver application shown in FIG. 1 and FIG. 2, the resistances and capacitances in the LO path and IF path phase shifting networks 331, 338 are tightly matched in a BiCMOS or CMOS IC fabrication process or the like. Then, when the LO path phase shifting network 331 is adjusted by the phase detector 336 to maintain a precise ninety degree phase difference in the LO path, the feedback control signal 337 from the phase detector 336 can be also used to maintain a precise ninety degree phase difference in the IF path using the IF phase shifting network 338 despite amplitude fluctuations in the IF signal.

The active double-balanced mixer and an integrated phase locked quadrature generator with phase detector feedback implemented using an advanced BiCMOS or CMOS IC fabrication process or the like allows the close matching of a second RC phase shifting network to a first RC phase shifting network resulting in a fully integrated image reject mixer. While specific components and functions of the integrated image reject mixer are described above, fewer or additional features could be employed by one skilled in the art within the true spirit and scope of the present invention. The invention should be limited only by the appended claims.

We claim:

1. An image reject mixer comprising:
   a local oscillator for producing a local oscillator signal;
   a local oscillator phase shifting network, coupled to the local oscillator, for producing an in-phase local oscillator signal and a quadrature local oscillator signal from the local oscillator signal;
   a phase detector, coupled to the local oscillator phase shifting network, for examining a phase of the in-phase local oscillator signal and a phase of the quadrature local oscillator signal and producing a control signal for adjusting the phase of the in-phase local oscillator signal and the phase of the quadrature local oscillator signal; and
   an intermediate frequency phase shifting network, coupled to the phase detector, for adjusting a phase of an in-phase intermediate frequency signal and a phase of a quadrature intermediate frequency signal in response to the control signal.

2. An image reject mixer according to claim 1 further comprising:
   an in-phase mixer, coupled to the in-phase local oscillator signal and adapted to receive a radio frequency signal, for mixing the in-phase local oscillator signal and the radio frequency signal.

3. An image reject mixer according to claim 2 further comprising:
   a low noise amplifier, coupled between the radio frequency signal and the in-phase mixer.

4. An image reject mixer according to claim 2 further comprising:
   a quadrature mixer, coupled to the quadrature local oscillator signal and adapted to receive the radio frequency signal, for mixing the quadrature local oscillator signal and the radio frequency signal.

5. An image reject mixer according to claim 4 further comprising:
   a low noise amplifier, coupled between the radio frequency signal and the quadrature mixer.

6. An image reject mixer according to claim 4 wherein the intermediate frequency phase shifting network is also coupled to the inphase mixer and the quadrature mixer.

7. An image reject mixer according to claim 1 further comprising:
   a summer, coupled to the in-phase intermediate frequency signal and the quadrature intermediate frequency signal.

8. An image reject mixer according to claim 1 wherein the intermediate frequency phase shifting network is adapted to receive an incoming signal, and the in-phase intermediate frequency signal and the quadrature intermediate frequency signal are produced in response to the incoming signal.

9. An image reject mixer according to claim 8 further comprising:
   an in-phase mixer, coupled to the in-phase local oscillator signal and the in-phase intermediate frequency signal.

10. An image reject mixer according to claim 9 further comprising:
    a quadrature mixer, coupled to the quadrature local oscillator signal and the quadrature intermediate frequency signal.

11. An image reject mixer according to claim 10 further comprising:
    a summer, coupled to the in-phase mixer and the quadrature mixer.

12. An image reject mixer according to claim 1 wherein the local oscillator phase shifting network comprises:
    a first capacitor, coupled to the local oscillator;
    a first resistor, coupled to the local oscillator;
    a second capacitor, coupled to the first resistor; and
    a second resistor, coupled to the first capacitor and the second capacitor.

13. An image reject mixer according to claim 12 wherein the second capacitor is coupled between the first resistor and ground and the second resistor is coupled between the first capacitor and ground.

14. An image reject mixer according to claim 12 wherein the first resistor is a variable resistor and the second resistor is a variable resistor.

15. An image reject mixer according to claim 12 wherein the first capacitor is a variable capacitor and the second capacitor is a variable capacitor.

16. An image reject mixer according to claim 1 wherein the intermediate frequency phase shifting network comprises:
    a first capacitor;
    a first resistor, coupled to the first capacitor;
    a second capacitor, coupled to the first resistor; and
    a second resistor, coupled to the first capacitor and the second capacitor.

17. An image reject mixer according to claim 16 wherein the second capacitor is coupled between the first resistor and ground and the second resistor is coupled between the first capacitor and ground.

18. An image reject mixer according to claim 16 wherein the first resistor is a variable resistor and the second resistor is a variable resistor.

19. An image reject mixer according to claim 16 wherein the first capacitor is a variable capacitor and the second capacitor is a variable capacitor.

20. A radiotelephone comprising:
    A) an antenna;
    B) an image reject mixer integrated onto a single integrated circuit, coupled to the antenna, having:
       1) a local oscillator for producing a local oscillator signal;
       2) a local oscillator phase shifting network, coupled to the local oscillator, for producing an in-phase local oscillator signal and a quadrature local oscillator signal from the local oscillator signal including:
          a) a first capacitor, coupled to the local oscillator;
          b) a first resistor, coupled to the local oscillator;

c) a second capacitor, coupled to the first resistor; and d) a second resistor, coupled to the first capacitor and the second capacitor;

3) a phase detector, coupled to the local oscillator phase shifting network, for examining a phase of the in-phase local oscillator signal and a phase of the quadrature local oscillator signal and generating a control signal for adjusting the phase of the in-phase local oscillator signal and the phase of the quadrature local oscillator signal; and 4) an intermediate frequency phase shift network, coupled to the phase detector, for adjusting a phase of an in-phase intermediate frequency signal and a phase of a quadrature intermediate frequency signal in response to the control signal including:

a) a first capacitor;

b) a first resistor, coupled to the first capacitor;

c) a second capacitor, coupled to the first resistor; and d) a second resistor, coupled to the first capacitor and the second capacitor;

C) an audio speaker, coupled to the image reject mixer.

21. A method for image reject mixing comprising the steps of:

producing a local oscillator signal;

creating an in-phase local oscillator signal and a quadrature local oscillator signal from the local oscillator signal;

examining a phase of the in-phase local oscillator signal and a phase of the quadrature local oscillator signal and generating a control signal for adjusting the phase of the in-phase local oscillator signal in relation to the phase of the quadrature local oscillator signal; and adjusting a phase of an in-phase intermediate frequency signal in relation to a phase of a quadrature intermediate frequency signal using the control signal.

* * * * *

UNITED STATES PATENT AND TRADEMARK OFFICE
CERTIFICATE OF CORRECTION

PATENT NO. :
DATED         :    5,870,670
INVENTOR(S) :   February 25, 1999

Ripley et al.

It is certified that error appears in the above-indentified patent and that said Letters Patent is hereby corrected as shown below:

Claim 6

In column 5, line 62, please replace "the inphase mixer" with --the in-phase mixer--.

Signed and Sealed this

First Day of June, 1999

Attest:

Q. TODD DICKINSON

*Attesting Officer*       *Acting Commissioner of Patents and Trademarks*